United States Patent
Miyake et al.

(10) Patent No.: US 6,287,889 B1
(45) Date of Patent: Sep. 11, 2001

(54) DIAMOND THIN FILM OR THE LIKE, METHOD FOR FORMING AND MODIFYING THE THIN FILM, AND METHOD FOR PROCESSING THE THIN FILM

(75) Inventors: Shoji Miyake, Osaka; Shu-Ichi Takeda, Kanagawa, both of (JP)

(73) Assignee: Applied Diamond, Inc. (JP)

( * ) Notice: Subject to any disclaimer, the term of this patent is extended or adjusted under 35 U.S.C. 154(b) by 0 days.

(21) Appl. No.: 09/490,991

(22) Filed: Jan. 26, 2000

(30) Foreign Application Priority Data

Jan. 27, 1999 (JP) ................................................. 11-018187

(51) Int. Cl.$^7$ ................................................. H01L 21/00
(52) U.S. Cl. ..................... 438/105; 438/105; 438/487; 438/532; 438/535; 438/584; 438/758; 438/931; 438/771; 438/772; 438/776; 438/777; 257/76; 257/77; 257/505; 118/50; 118/900; 118/620; 118/621; 428/620; 428/621; 428/622; 428/627
(58) Field of Search ..................... 438/105, 487, 438/532–35, 584, 758, 931, 771–77; 257/505, 76–77; 427/523–560, 569–600; 118/50, 900, 620–41; 428/620–687

(56) References Cited

U.S. PATENT DOCUMENTS

| | | | |
|---|---|---|---|
| 4,399,364 | 8/1983 | Evans et al. | 250/492.1 |
| 4,762,729 | * 8/1988 | Hirano et al. | 427/38 |
| 5,023,068 | * 6/1991 | Jones | 423/446 |
| 5,188,862 | * 2/1993 | Itatani et al. | 427/570 |
| 5,225,245 | * 7/1993 | Ohta et al. | 427/248.1 |
| 5,286,524 | 2/1994 | Slutz et al. | 427/249 |
| 5,300,188 | * 4/1994 | Tessmer et al. | 156/636 |
| 5,373,171 | * 12/1994 | Imai et al. | 257/77 |
| 5,385,762 | 1/1995 | Prins | 427/526 |
| 5,514,603 | * 5/1996 | Sato | 437/16 |
| 5,523,071 | 6/1996 | Jackson et al. | 423/446 |
| 5,531,184 | * 7/1996 | Muranaka et al. | 117/108 |
| 6,082,294 | * 7/2000 | Simpson | 118/723 |
| 6,110,276 | * 8/2000 | Yu et al. | 117/94 |

FOREIGN PATENT DOCUMENTS

| | | |
|---|---|---|
| 62-43960 | 9/1980 | (JP) . |
| 5-306194 | 11/1993 | (JP) . |
| 6-166594 | 6/1994 | (JP) . |
| 7-165494 | 6/1995 | (JP) . |

OTHER PUBLICATIONS

Krauss et al. "Cold cathode electron emission properties of nanocrystalline diamond thin films" IEEE—US Dept. of energy #W–31–109–Eng–38 and Office of Naval research #N0014–97–f0905 Apr. 1997 pp. 186–187.*

(List continued on next page.)

Primary Examiner—Matthew Smith
Assistant Examiner—Granvill D Lee
(74) Attorney, Agent, or Firm—Howson and Howson

(57) ABSTRACT

An improved gas phase synthesized diamond, CBN, BCN, or CN thin film having a modified region in which strain, defects, color and the like are reduced and/or eliminated. The thin film can be formed on a substrate or be a free-standing thin film from which the substrate has been removed. The thin film can be stably and reproducibly modified to have an oriented polycrystal structure or a single crystal structure. The thin film is modified by being subjected to and heated by microwave irradiation in a controlled atmosphere. The thin film has a modified region in which a line width of the diamond spectrum evaluated by Raman spectroscopy of 0.1 microns or greater is substantially constant along a film thickness direction of the thin film, and the line width of the modified region is 85% or less of a maximum line width of the residual portion of the film thickness.

17 Claims, 3 Drawing Sheets

OTHER PUBLICATIONS

Koretzky et al. "A Microwave plasma system for the deposition of diamond films" IEEEPlasma Science, 1996. IEEE Conference Record—Abstracts. —Weber research Institute and Brookhaven National laboratory supported by AFOSR 3Ip05 p. 217.*

Zhu et al. "Growth and characterization of diamond films on nondiamond substrates for electronic applications" Proceedings of the IEEE 0018–9219/91/0500 vol. 79 May 1991 pp. 621–646.*

* cited by examiner

DIAMOND THIN FILM OR THE LIKE, METHOD FOR FORMING AND MODIFYING THE THIN FILM, AND METHOD FOR PROCESSING THE THIN FILM

FIELD OF THE INVENTION

The present invention generally relates to a gas phase synthesized thin film formed, for instance, by chemical-vapor-deposition (CVD) techniques. In particular, the present invention relates to a thin film made of: diamond; cubic boron nitride (CBN); boron carbon nitride (BCN), which includes a solid solution of CBN and diamond; or cubic carbon nitride (CN). (The above listed thin films will hereinafter be referred to as "diamond thin films or the like".) More particularly, the present invention relates to diamond thin films or the like in which strain, defect, color, or the like which exist in free standing foil, or plate, diamond thin films or the like are eliminated, reduced, or modified to an oriented polycrystal or single crystal structure. The present invention also relates to a method of modifying the above referenced thin films, a method of modifying and forming the above referenced thin films, and a method for processing the above referenced thin films. (Unless otherwise specified, the diamond thin films or the like referred to hereinafter contain a free-standing diamond film or like film which is formed on a substrate or the like.)

BACKGROUND OF THE INVENTION

There are a variety of diamond types, such as, transparent large-sized single crystal or colored crystal diamonds which have various lattice defects, or impurities, (ie. Ni or Si) contained in the crystals. These diamonds are classified into type I diamonds with light absorption at a wavelength of 3000 angstroms or less in the ultraviolet region and type II diamonds with transmission of light at 2250 angstroms or more. A type II diamond is purer than a type I diamond.

Type I diamonds are further classified into type Ia diamonds which contain 0.1% or less of nitrogen (this type includes most of the natural diamonds) and type Ib diamonds in which nitrogen of 500 ppm or more is replaced with carbon. Type II diamonds can be classified into type IIa high resistance diamonds (free of nitrogen) and type IIb p-type semiconductor diamonds.

Diamonds have various desirable properties such as high hardiness, low thermal expansion coefficients, chemical stability (ie. inactive), high thermal conductivity, high electrical insulation, high infrared transmission, high reflectivity, high sound velocity, wide band gap semiconductor characteristics, high-speed carrier properties, color center, negative electron affinity, physiological adaptability, and superior acoustic characteristics and so on.

Based on the above referenced characteristics, diamonds are utilized in many industrial applications which include: cutting tools; wear-resistant coating materials; circuit substrates; high frequency devices; heat sinks; various optical parts; electronic device parts such as semiconductors and radiation sensors; surface acoustic wave filters; speakers; and physiological functional parts such as artificial joints.

It has been well known for many years that diamonds can be successfully synthesized under a high pressure. Therefore, diamonds have been widely utilized as industrial materials for many years. More recently, diamond thin films which have many of the above stated advantageous characteristics have attracted more attention since a technique was developed for producing diamond thin films in a gas phase.

A well known method for forming a thin film on a substrate is chemical-vapor deposition (CVD). This method includes several techniques. One method includes: setting an open quartz tube at a position close to a tungsten filament which is heated at a high temperature of about 2000° C.; and introducing through the quartz tube a diluted mixed gas of hydrocarbon gas, such as methane and hydrogen, which thereby causes the diamond in the mixed gas to be deposited on a substrate heated to within a range of 500° C. to 1100° C. Other methods include a microwave plasma CVD technique, a radio frequency (RF) plasma CVD technique, or a direct current (DC) arc plasma jet technique which all utilize plasma discharge instead of the above described hot filament technique. Another method is to decompose and deposit diamonds from a hydrocarbon-containing gas (ie. oxygen-acetylene) at high speed in the air known as the combustion-flame method.

In the above methods, a diamond is formed by the principle that hydrogen is dissociated to atomic species, whereby graphite produced simultaneously is preferentially eliminated to grow a film of diamond structure. The mechanism of diamond formation is very complicated, and is not completely well understood at present.

These methods provide diamonds having various different qualities, manufacturing operabilities and capabilities. In addition, the actual qualities of these diamonds are very sensitive to many factors, such as, gas or electron temperature, reaction gas composition, gas pressure, reaction gas flow rate, substrate material, substrate temperature, deposition machinery, and so on, and the methods do not obtain a satisfactory level of stable and reproducible production with high efficiency.

In particular, the microwave plasma CVD technique and the RF plasma CVD technique which utilize plasma discharge each have the problem of requiring complicated and expensive devices having complicated load monitoring systems for stabilizing the plasmas. In addition, there is the disadvantage that diamond growth is very slow even when expensive devices are utilized, and high density defects or strains exist in the obtained diamond film structure.

Stresses due to tensile or compressive strain are present in diamond thin films which are formed on substrates utilizing any of the above described CVD methods. Occasionally, the diamond thin films crack or slip off the substrates.

The occurrence of such strains is caused by defects in the diamond thin film, impurities on the grain boundary and grain boundary sections, as well as by differences in the thermal expansion characteristics between the substrate and the diamond.

In addition, even if an attempt is made to obtain a diamond thin film with specified properties, a pseudo diamond with poor characteristics is formed, a diamond-like carbon thin film is formed, or quality degradation such as the generation of graphite frequently occurs.

As described above, even if at present the CVD technique is one of the effective means for forming a diamond film, a satisfactory result is not obtained. Thus, at present, a diamond thin film cannot be produced stably and reproducibly.

Attempts have been made to form diamond films on both sides of a substrate utilizing CVD techniques in order to overcome the problems related to the formation of stresses. See Japanese Patent Laid-open No. 5-306194.

However, with respect to forming films on both sides of a substrate, there is no guarantee that the same diamond film is formed correctly and uniformly on both sides of the substrate. Although the above reference describes a hope for uniformly forming a film so that unbalanced internal strain is eliminated, attempts have not proven satisfactory. Therefore, strains still exist in the crystal.

Moreover, it is difficult to ideally obtain such a diamond film unless the substrate heating temperature, gas flow direction for forming the film, and decomposition and deposition are precisely controlled to ensure that uniform diamonds are formed on both sides of the substrate. This creates an additional problem that the stated device and control method must become extremely complicated and expensive.

Another proposal has been disclosed in which diamond is annealed in an alumina furnace in an atmosphere of hydrogen or a mixed gas of hydrogen and inert gas for the purpose of reducing the intervening materials existing in synthetic diamond powders and reducing the residual strain in a diamond lattice to improve toughness. See Japanese Patent Laid-open No. 7-165494. Further, there has been an attempt to perform electron beam irradiation and heating to 1600° C. to 2200° C. in order to reduce the color of diamond powders. See Japanese Patent Publication No. 62-43960. There has also been an attempt to dope diamond with a high level of nitrogen, boron, arsenic, phosphorus and so on to damage the surface of diamond crystals and then to perform annealing using a coil to recover lattice damage. See Japanese Patent Laid-open No. 6-166594.

Although all of these above stated methods provide a certain effect in reducing strain, their efficiency is small, and it is not easy to restore crystals which are damaged/roughed as suggested in the last disclosed reference. In any case, all of the above methods do not provide an effective means for decreasing the residual strain of the diamond lattice.

Meanwhile, attention has also been recently given to CBN thin films, BCN thin films, and CN thin films which have the same crystal structure and similar hardness as diamonds. These thin films consist of two- or three-components and the films readily deviate from a stoichiometric composition (in CBN, there occurs a phenomenon that the composition ratio B/N fluctuates locally), and defects or strains are more likely to occur.

In particular, it is expected that the CBN film can be formed as a high-temperature semiconductor film. There is the possibility that an n-type semiconductor can be produced and that an ultra high speed carrier transistor in combination with diamond having p-type semiconductor characteristics may be producible. It is also expected that a CN film can form a harder film than diamond. However, there is still the problem that strains and defects are likely to occur during film deposition, thus making it impossible to ensure practical use.

OBJECTS OF THE INVENTION

An object of the present invention is to effectively eliminate or reduce the strain, defects, color, and so on which exist in a diamond thin film or the like produced by gas phase deposition on a substrate and in a foil or plate of a free standing diamond.

A further object of the present invention is to modify a diamond thin film or the like to polycrystal, preferentially oriented polycrystal or single crystal, in a stable and reproducible manner.

A still further object of the present invention is to provide a method of modifying and forming a diamond thin film or the like.

SUMMARY OF THE INVENTION

The present invention is a thin film which is selected from the group consisting of a diamond thin film, a CBN thin film, a BCN thin film, and a CN thin film. The thin film has a modified film thickness region in which a line width of a diamond spectrum evaluated by Raman spectroscopy of at least 0.1 microns is substantially constant along a film thickness direction of the thin film. The thin film also has an unmodified residual thickness which has a determinable maximum line width. The line width of the modified film thickness region is no greater than about 85% of the maximum line width of the unmodified residual thickness.

According to another aspect of the present invention, the modified film thickness region of the above referenced thin film has a reflection index which is at least 0.1% greater than a minimum reflection index of the unmodified residual part of the thin film.

With respect to any of the above referenced thin films, preferably at least a part of the modified film thickness region has a polycrystal, highly-oriented polycrystal, or a single crystal structure. According to one alternative, at least a part of the modified film thickness region is semi-conducted. An additional layer can also be formed on the modified film thickness region of the thin film and have a polycrystal, highly-oriented polycrystal, or a single crystal structure. In addition, at least a part of the thin film can be covered with a layer selected from the group consisting of a metal layer, a ceramic layer, a conducting layer, or an insulating layer.

According to another aspect of the present invention, a method of forming a thin film is provided. A first step is to obtain a thin film selected from the group consisting of a diamond thin film, a CBN thin film, a BCN thin film, and a CN thin film. The next step is to modify the thin film by irradiating it with a microwave of 1 to 500 GHz. The thin film is heated by the microwave irradiation, preferably to a temperature between about 500° C. to 3000° C.

Preferably the thin film is subjected to the modification in a controlled atmosphere selected from the group consisting of an evacuated atmosphere, an inert gas atmosphere, a reductive gas atmosphere, and a mixed atmosphere. The method can include the step of introducing at least one gas into the controlled atmosphere simultaneously with the modifying step. The gas can be selected from the group consisting of a hydrogen supply gas, a carbon supply gas, a nitrogen supply gas, a boron supply gas, and a gas containing a semi-conductor element. The introduction of the gas modifies and simultaneously forms an additional thin film layer on the thin film. The additional thin film layer can be selected from the group consisting of a polycrystalline thin film, a oriented polycrystalline thin film, a single crystal thin film, and a semi-conductor thin film.

The above stated methods can include a second modifying step in which the thin film is again irradiated with a microwave of 1 to 500 GHz to further modify, heat and/or shape the thin film.

According to a further aspect of the present invention, the thin film can be one that has been damaged by a laser beam cutting device, and the modifying step is utilized to repair the damaged thin film.

DETAILED DESCRIPTION OF THE PREFERRED EMBODIMENTS AND METHODS

Figure 1:
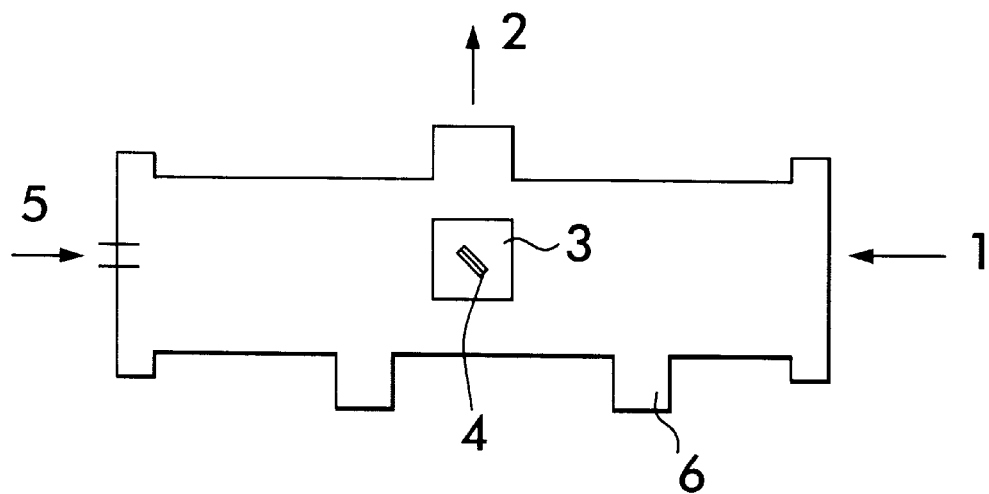
FIG. 1 is a schematic view illustrating an apparatus wherein a diamond thin film or the like is disposed in a microwave irradiation device, and a microwave of 1 GHz to 500 GHz is irradiated to the thin film to thereby heat the thin film.

Carbon bonding, such as, sp bonding or $sp^2$ bonding, is typically formed during the deposition of a diamond thin film produced via a gas phase technique. The carbon bonding is a bonding form other than the diamond component in the diamond thin film. As the amount of the non-diamond component significantly increases, defects are often generated in the prepared diamond film, and film crystalline properties are likely to be reduced. In addition, a significant strain is induced in the vicinity of the grain boundary since the diamond crystal grain are grown with uncomfortable orientation in the film.

The existence of the non-diamond component and the existence of strain in the vicinity of the grain boundary as well as inside the grain are considered to be the causes of preventing hetero epitaxial growth of a single crystal diamond.

As a method for investigating defects of such diamonds, Raman spectroscopy is said to be the most effective analytical method for identifying and quantifying non-diamond components contained in a diamond thin film and for investigating the diamond crystalline properties themselves. See Toray Research Center, THE TRC NEWS, No. 35, April 1991, pp. 16–21, "Evaluation of Diamond (shaped) Film with Raman Spectroscopy".

In the present invention, a half line ($cm^{-1}$) of Raman spectrum was utilized as one of the methods for evaluating strain, e.g., the degree of crystallinity in a diamond thin film or the like. To this end, the line width of a natural diamond and that of a diamond thin film or the like obtained in accordance with the present invention were compared and their characteristics were investigated.

If the line width of the diamond thin film or the like closely resembles that of a natural diamond, it is believed that internal grain lattice defects and electronic defects related to impurities, lattice defects and non-uniform strain have been substantially eliminated in the diamond thin film or the like and crystallinity close to that of a natural diamond has been obtained. An additional comparison for evaluating defects can be carried out by obtaining and comparing cathode luminescence (CL) images of the diamond thin film or the like and the natural diamond.

As described above, according to the present invention, a microwave of 1 GHz to 500 GHz is irradiated to a diamond thin film or the like to heat the thin film and to modify the diamond thin film or the like.

It has been determined that a microwave frequency of 1 GHz or less is insufficient to heat a diamond thin film or the like, and that a microwave frequency exceeding 500 GHz does not provide a penetration depth which is large enough to modify the thin film in a satisfactory manner. Therefore, it is necessary to utilized a microwave in the above stated range.

A vacuum, inert gas, reductive gas, or mixed gas atmosphere which is capable of preventing graphitizationize of the diamond thin film or the like is utilized according to the present invention.

Also, a gas is directly or partially ionized to be a plasma by microwave irradiation. In addition, an irradiated element such as diamond is also heated.

As described previously, it is known that a diamond thin film can be produced by utilizing a conventional microwave for plasma generation. However, the prior art does not disclose microwave irradiating and heating of the diamond thin film or the like directly or together with plasma. Thus according to the present invention, a diamond thin film or the like is generated and modified.

From this point of view, it was not anticipated from the foregoing that a microwave of 1 to 500 GHz would be effective in modifying a diamond thin film or the like. The modification of the diamond thin film or the like resulted in the elimination of defects and strains which previously existed in the diamond thin film or the like.

In addition, as mentioned above, the use of electronic beam or in-furnace annealing means as a modification means has been proposed; however, these have not been proven to be efficient means for eliminating defects in a diamond thin film or the like.

As described above, the present invention is novel and provides a significant effect in that a diamond thin film or the like which was formed by a gas phase technique and which contained defects and/or strains can be modified to provide superior properties.

EXAMPLES AND COMPARATIVE EXAMPLES

Hereinafter, Examples of the present invention will be described in comparison with Comparative Examples. It should be understood that the scope of the present invention is not meant to be limited by the following Examples. In addition, as otherwise specified, although Examples and Comparative Examples of a diamond thin film are discussed below, the findings are equally applicable to a CBN, BCN, or CN thin film.

Example 1 and Comparative Example

In Example 1, a diamond thin film is disposed in a microwave irradiation device 6, and a microwave of 1 to 500 GHz is irradiated to the thin film 4 to heat the thin film 4. FIG. 1 is a schematic view illustrating the device 6.

An alumina fiber based ($AL_2O_3$) fiberboard container 3 is disposed near the center of the device 6, wherein a free standing diamond film, or sample, 4 is placed. A microwave 1 is irradiated to the free standing diamond film 4 at an angle of 45 degrees.

A thermometric measuring instrument, such as a Thermal Video System, is set in the alumina fiber container 3 at a position which is 90 degrees relative to the microwave incident direction 1. The temperature of the diamond surface is measured at all times.

Figure 2:
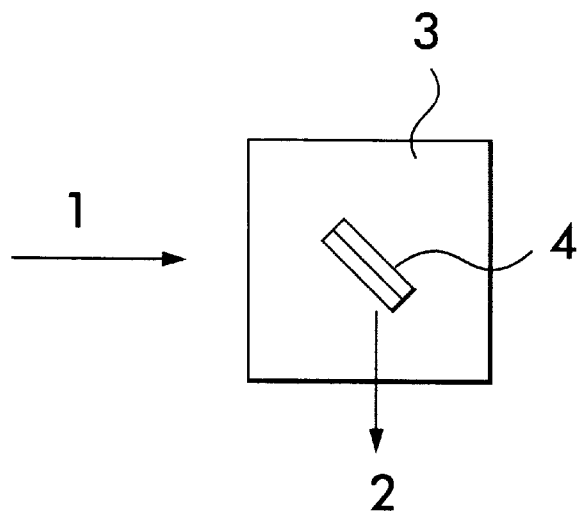
FIG. 2 is an illustrative view showing samples in the microwave irradiation device, the microwave irradiation direction, and the temperature measuring arrangement.

FIG. 2 is an enlarged view illustrating the disposition of sample 4 and irradiation direction 1 and the temperature measurement of the microwave 2. In the instrument 6, a nitrogen gas containing a small amount of hydrogen Linder ambient pressure was supplied via valve 5 in a $N_2$ gas flow slightly containing $H_2$. In the illustrative Example, a pulse microwave of 60 GHz at a pulse width of 5.5 msec and repetition frequency of 5 Hz was employed, although a continuous microwave could also be utilized.

In the illustrative Example, a free-standing diamond film synthesized by a gas phase technique was utilized. However, a diamond thin film formed on a substrate can also be used.

In the free-standing diamond film, for example, a thin film is formed on a Mo substrate by a DC arc plasma CVD technique utilizing plasma electric discharge. Then, the prepared diamond film is heated and released from the substrate by utilizing the difference in thermal expansion between the diamond and substrate. Alternatively, the prepared diamond can be removed from the substrate by chemical means. A 500-micron film, ie. a free standing film, was created by laminating two films and was placed as a sample in an $AL_2O_3$ fiber container.

The free-standing diamond film is capable of being produced by several techniques, for example, a microwave plasma CVD technique, an RF plasma technique, or a combustion-flame (oxygen acetylene) technique.

In the illustrative Example of the present invention, a number of free-standing diamond film samples were prepared and irradiated at an angle of 45 degrees with pulse microwave of 60 GHz. The samples were heated to 800° C., 1300° C., 1500° C., 1800° C., 2200° C., and 2500° C., respectively.

As a Comparative Example, samples of a natural diamond and free-standing diamond films were prepared and not irradiated. The results are discussed below.

Test 1

Figure 3:
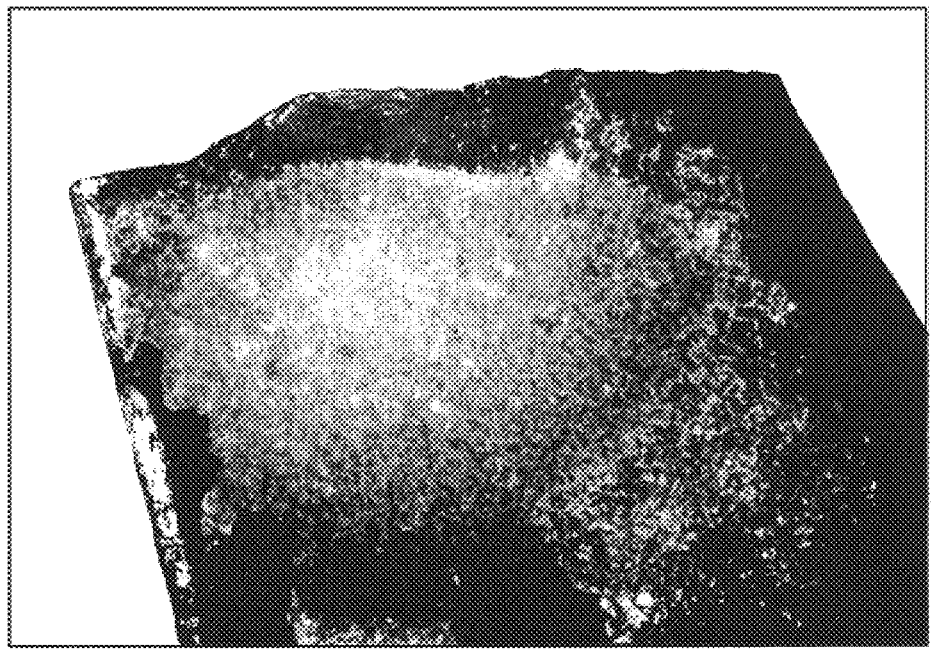
FIG. 3 is a digital printout of a digitally scanned cathode luminescence image in the vicinity of an as grown surface of a free-standing diamond film which was heated to 1500° C. using a microwave of 60 GHz in the illustrative Example according to the present invention.

The first comparison is that of cathode luminescence (CL) images. In FIG. 3, with respect to the same sample in which a diamond is grown by a gas phase technique, a cathode luminescence image (×20) is shown in which the as grown surface, or final growth surface, is heated to an arrival temperature of 1500° C. via the above discussed pulse microwave of 60 GHz. In addition, the irradiated front of the sample was mechanically removed to improve analytical accuracy. The removed front has a thickness of about 50 microns.

Figure 4:
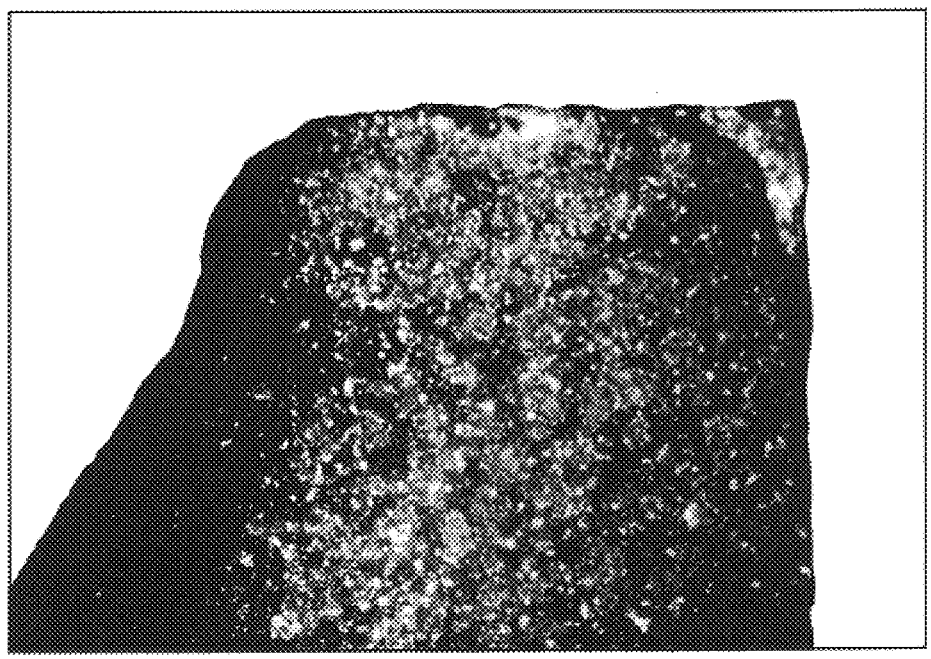
FIG. 4 is a digital printout of a digitally scanned cathode luminescence image showing a plane in the vicinity of an as grown free-standing diamond surface which has not been irradiated by microwave.

In FIG. 4, as a Comparative Example, a cathode luminescence image (×30) of a non-irradiated sample is shown.

As is evident from a comparison of FIGS. 3 and 4, it is found that the CL emission in the illustrative Example of the present invention in FIG. 3 is extremely increased as compared to the CL emission of the non-irradiated sample of the Comparative Example shown in FIG. 4. That is, it is found that the embodied diamond showed CL emission approximate to a type Ia or Ia+Ib natural diamond because lattice defects and strains in the vicinity of the grain boundary were extensively eliminated.

This result shows that defects and strain distributed on the plane of the diamond analyzed, as well as along the thickness of the diamond analyzed, decreased. In any case, it has been found that heating with microwave irradiation is effective for modifying diamond thin films and the like.

Test 2

The diamond thin film samples of the illustrative Example according to the present invention which were irradiated and heated to 800° C., 1300° C., 1500° C., 1800° C., 2200° C., and 2500° C. using a pulse microwave of 60 GHz, were compared with a line width ($cm^{-1}$) of Raman spectrum of a natural diamond. The line widths ($cm^{-1}$) of the Raman spectrum of the natural diamond are shown in FIG. 5.

Figure 5:
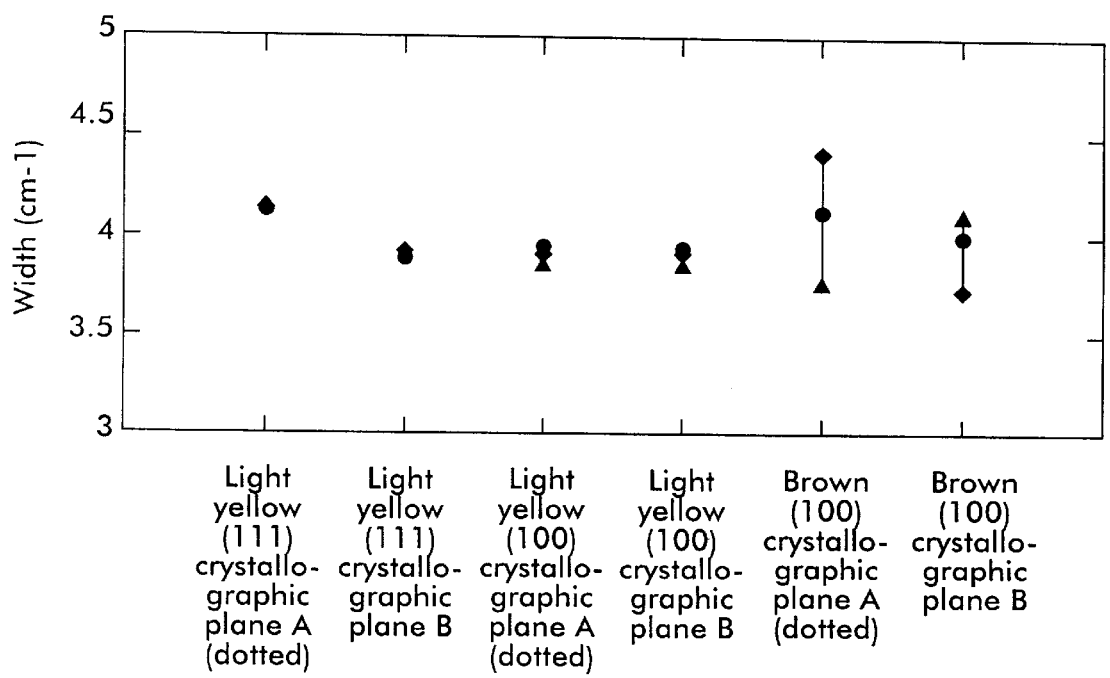
FIG. 5 is a line width ($cm^{-1}$) of Raman spectrum of a natural diamond.

In the FIG. 5, six kinds of line widths are shown from a light yellow (111) plane to a brown (100) plane of a natural diamond. All the line widths are within the range of about 3.5 to 4.5 $cm^{-1}$.

Figure 6:
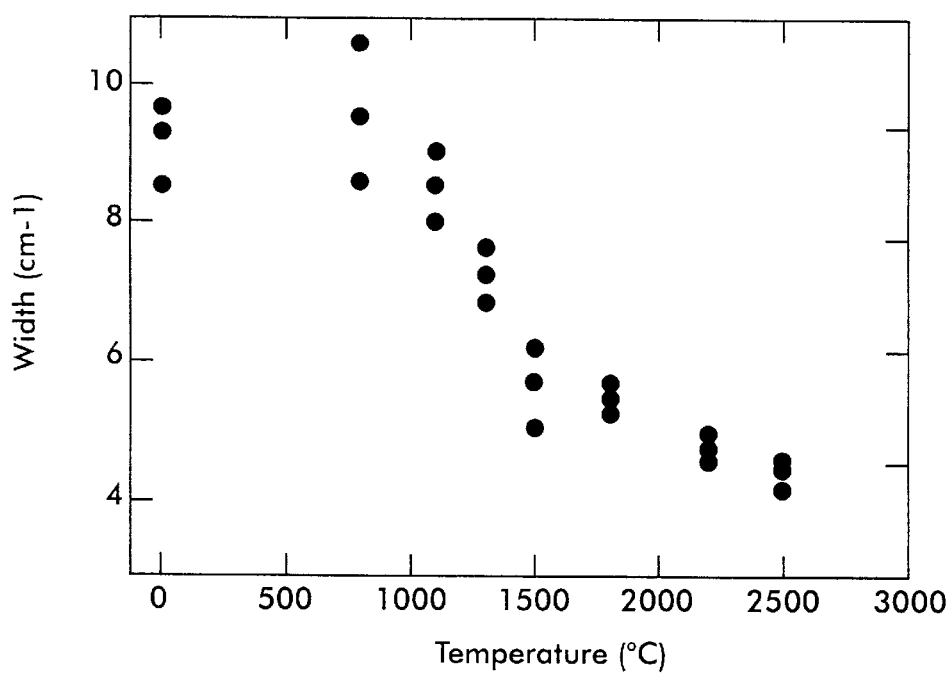
FIG. 6 is a graph showing an Example in which the line width of the Raman spectrum of a diamond thin film irradiated at each temperature is obtained and a Comparative Example in which the line width is shown for a sample which has not been irradiated.

In FIG. 6, a line width ($cm^{-1}$) of the Raman spectrum of the illustrative Example of the present invention in which a microwave is irradiated to the thin film up to the above stated temperatures is shown. At the left end of the graph, a line width ($cm^{-1}$) of the Raman spectrum of the Comparative Example, ie. non-irradiated sample, is shown which has a line width ranging from about 8 to 10 $cm^{-1}$ In contrast, the diamond of the illustrative Example which was irradiated and heated to 1300° C. has a line width of about 7 to 7.5 $cm^{-1}$. Further, the diamond of the illustrative Example which was irradiated and heated to 1500° C. has a line width of about 5 to 6 $cm^{-1}$. Further, the diamonds of the illustrative Example which were irradiated and heated from 2200° C. up to 2500° C. obtained a line width of about 4 to 5 $cm^{-1}$. Thus, it was verified that the inventive diamond has a line width which closely approximates the line width of a natural diamond. This result is in agreement with the above discussed cathode luminescence data.

In heating up the diamond to 800° C. as shown in FIG. 6, a tendency is shown in which the line width of the inventive diamond is slightly greater than the line width of the non-irradiated Comparative Example. However, it was observed that microwave absorption becomes efficient at a temperature of about 500° C.

It is estimated that the line width tends to increase during the course of initial strain and electric defect recovery; however, a clear reason for this is not yet known. However, a modifying effect is present from about 500° C.

An improvement in line width was shown increasing with heating temperature. This shows that microwave irradiation is very effective for modifying strain, defects and so on in the diamond crystal structure.

In the illustrative Example, a microwave of 60 GHz was employed; however, a modification effect was verified at a microwave of 1 GHz or more. In addition, although irradiation in excess of 500 GHz was carried out, the microwave at such high frequencies did not penetrate into the diamond film, and no modifying effect was verified. Therefore, it has been determined that a microwave of 1 to 500 GHz is effective in modifying diamond thin films and the like.

In addition, it was verified that a microwave heating temperature brings about a modification effect in the range of about 500° C. to 3000° C., which depends on the characteristic of the diamond film.

Example 2

A free-standing diamond film having a thickness of greater than 100 microns and a polycrystal structure, and a free standing diamond film having a thickness of 500 microns and a polycrystal portion of preferred orientation were obtained. Irregularities which formed on the final growth face of the films were flattened, and the final growth surfaces were irradiated and heated by a microwave of 60 GHz. The modification of the films were carried out in an atmosphere containing an Argon gas flow, and the heating temperature was 800° C.

Tables 1 and 2, below, each show the relationship between the microwave outputs and the temperature (arrival temperature) being attainable with the film, ie. the same microwave power was irradiated twice against the diamond film.

The diamond thin film is heated to 800° C. and is then subjected to a second separate irradiation using the same conditions. It was found that the arrival temperature is lower in the second irradiation. For instance, the temperature listed in Table 2 is lower then the corresponding temperature listed on Table 1 for the same applied conditions. Thus, it is confirmed that the arrival temperature of the film is lowered when the film is subjected to further irradiation treatment.

TABLE 1

| Time (min) | Temperature (° C.) | Superconductive Coil Current (A)* |
|---|---|---|
| 0 | 25 | 24.46 |
| 10 | 85 | 24.46 |
| 20 | 101.5 | 24.46 |
| 30 | 137 | 24.46 |
| 40 | 169 | 24.46 |
| 50 | 209 | 24.46 |
| 60 | 241 | 24.46 |
| 70 | 280 | 24.46 |
| 80 | 310 | 24.46 |
| 90 | 350 | 24.46 |
| 100 | 380 | 24.46 |
| 110 | 420 | 24.46 |
| 120 | 450 | 24.46 |
| 130 | 490 | 24.46 |
| 140 | 521 | 24.46 |
| 150 | 558 | 24.46 |
| 160 | 589 | 24.46 |
| 170 | 617 | 24.46 |
| 180 | 659 | 24.46 |
| 190 | 696 | 24.46 |
| 200 | 732 | 24.46 |
| 210 | 764 | 24.46 |
| 220 | 800 | 24.46 |

*Microwave output is represented as a current value of a superconductive coil.

TABLE 2

| Time (min) | Temperature (° C.) | Superconductive Coil Current (A)* |
|---|---|---|
| 0 | 25 | 24.46 |
| 10 | 78 | 24.46 |
| 20 | 95 | 24.46 |
| 30 | 128 | 24.46 |
| 40 | 157 | 24.46 |
| 50 | 195 | 24.46 |
| 60 | 230 | 24.46 |
| 70 | 265 | 24.46 |
| 80 | 292 | 24.46 |
| 90 | 331 | 24.46 |
| 100 | 358 | 24.46 |
| 110 | 399 | 24.46 |
| 120 | 425 | 24.46 |
| 130 | 465 | 24.46 |
| 140 | 491 | 24.46 |
| 150 | 535 | 24.46 |
| 160 | 560 | 24.46 |
| 170 | 588 | 24.46 |
| 180 | 629 | 24.46 |
| 190 | 667 | 24.46 |
| 200 | 696 | 24.46 |
| 210 | 725 | 24.46 |
| 220 | 760 | 24.46 |

*Microwave output is represented as a current value of a superconductive coil.

Test 3

The reflection index of the films mentioned in Example 2 was also measured after the final growth faces were flattened. The depth positions of the measurement along the film thickness was prepared by sequential mechanical processing. The measurement of the reflection index along the film thickness from the as grown surface verified that a region having a constant reflection index is generated in the film thickness direction from the microwave irradiated front.

In addition, although this result should be obvious from the crystalline properties determined by the Raman spectrum, the irradiated front of the inventive diamond has a higher reflection index than the reflection index of the side of the diamond film opposite to the irradiated front of the film (ie. the portion of the film confronting the substrate).

A relationship between the reflection index characteristics and the dielectric constant of: [dielectric constant= (reflection index)$^{1/2}$], is met. It was shown by comparing the dielectric properties of the irradiated sample with a non-irradiated sample that a high-frequency dielectric loss is reduced in excess of 10% in the microwave irradiated thin film according to the present invention.

In view of a relation with the reflection index, when the reflection index of the microwave irradiation modified portion of a diamond thin film or the like is greater than the minimum reflection index of the non-irradiated portion of a diamond thin film or the like by 0.1% or more, a reduction of the high-frequency dielectric loss becomes greater.

A test was carried out in order to investigate whether or not an effect is attained due to conventional heating instead of microwave irradiation. The test was carried out through stepwise heating in a furnace up to 1600° C. As a result, no improvement of this property was obtained or observed utilizing conventional heating processes.

Thus, it was verified that heating of 500° C. or more through microwave irradiation is very effective at improving the property of high frequency dielectric loss in gas phase synthesized diamond films.

Example 3

In this example, a diamond thin film or the like was subject to microwave irradiation of 1 to 500 GHz and, at the same time, one or more gases selected from carbon, nitrogen, and boron supply source gases and gas containing semi-conductor elements were introduced. Thus, at the same time the diamond thin film or the like is being modified, a polycrystalline diamond thin film or the like, preferentially oriented polycrystalline film, single crystal thin film or a semiconductor thin film thereof is further deposited on the modified thin film element.

In a gas phase synthesizing process, as discussed above, non-diamond components are unavoidably generated in the diamond thin film. It has been found that the etching effect of atomic hydrogen generated by dissociation and activation of the carbon supply source gas (hydrocarbon/hydrogen based) generated in plasmas is effective to reduce this non-diamond component.

Therefore, in the present technique, in an attempt to qualify a polycrystalline diamond thin film, the carbon concentration in the carbon supply source is reduced, and a thin film growth rate is lowered.

In the meantime, this etching effect induces the generation of various lattice defects in the diamond thin film. In addition, a large quantity of tensile and compressive strain is accumulated in the vicinity of the grain boundary during diamond film growth owing to the difference of crystal thermal expansion depending on crystal orientation.

From the foregoing, conventionally, there has not been achieved a polycrystalline diamond film having high crystalline properties with reduced strain in the film, a polycrystalline film having a highly preferred orientation, and a single crystal film for generating a wide band gap semiconductor.

In the illustrative Example No. 3, a polycrystalline diamond thin film having a 10 microns thickness synthesized by a microwave CVD technique on a substrate was employed.

This diamond thin film and substrate were inserted into a microwave irradiation device as described with respect to Example No. 1, and a microwave of 1 GHz or more was irradiated to the diamond thin film to heat it. At the same time, a carbon supply source gas (hydrocarbon/hydrogen based) was introduced into the modifying atmosphere, and a diamond thin film was newly formed. Then, the structure of the obtained thin film was evaluated by Raman spectroscopy.

As a result, there was obtained a modified preferentially oriented polycrystalline film in which the line width of the diamond spectrum evaluated by Raman spectroscopy is 85% or less against the maximum line width value of the remaining portion of the film thickness. There was further obtained a diamond thin film having a single crystal structure on the above substrate (diamond films on substrate) by selection of microwave frequency. This structure was verified by SEM and X-ray diffraction in a similar manner.

Thus, it was found that a polycrystalline diamond film with less strain and high crystalline properties, a polycrystalline film having a preferentially oriented characteristic, and a single crystal film that have not been achieved in the prior art can be readily fabricated according to the present invention.

A diamond thin film or the like having a single crystal structure is particularly useful as a wide band gap semiconductor material or a high thermal conductivity heat sink.

Example 4

A production example of a diamond based electronic device in which a part of the modified portion of the diamond thin film or the like is provided with semiconductor characteristics, is described below with respect to Example No. 4.

As in Example No. 3, a diamond thin film having a substrate is inserted into a microwave irradiation device, and a microwave was irradiated to the diamond thin film. At the same time, a carbon supply source and a gas containing Boron as a semiconductor element were introduced into the modifying atmosphere. The result was that a p-type diamond polycrystalline thin film, a preferentially oriented polycrystalline diamond thin film, and a single crystal film were further formed on the initially placed diamond thin film.

It was verified that the characteristics of the obtained semiconductor thin film provides a significant improvement due to the modification effect of microwave irradiation. In the foregoing, although an example of the diamond thin film formed on a substrate was disclosed, a similar result was also obtained for a free-standing thin film.

Example 5

This example discloses a diamond thin film which is modified by microwave irradiation and which is utilized as a heat sink.

Components which require cooling can be fixed on the diamond thin film to improve thermal management properties (heat radiation) and to ensure electrical contact with the components. For this purpose, a metalized layer is formed on the diamond thin film in order to ensure proper device functioning.

In the illustrative Example, as described above, a microwave was irradiated on a diamond thin film and heated the film. A Ti, Pt, or Au metalized layer having a 0.5 microns thickness was formed on the diamond thin film by sputtering. The diamond thin film used in this case was provided with a modified position at which a line width of Raman spectrum of the diamond thin film evaluated by 0.1 micron or more is 85% or less of the maximum line width value of the residual portion of the film.

On the other hand, for the purpose of comparison, a metalized layer was formed similarly on a non-modified diamond thin film, and thermal management (heat radiation) properties thereof were compared with the above illustrative Example.

As a result, depending on the thickness of the diamond thin film or the thickness of the modified portion of the diamond thin film, the thermal conductivity was improved in the modified and metalized diamond heat sink, and the thermal management (heat radiation) properties was improved by at least 20%. Thus, the modification of the diamond thin film by microwave irradiation and heating improves the performance of a device having a metalized layer applied thereto.

Although the foregoing example was described with respect to a heat sink, it was also verified that the characteristics thereof is improved in an insulation film such as a ceramic film and a diamond thin film having a ceramic conductive film and so on.

Example 6

In general, a diamond thin film is used as a flat face by removing irregularities on the final growth face. The flattening process is carried out in a state in which the thin film is adhered to a substrate. The required processing of the smoothened and processed face and the specification thereof, constantly requires improvement as technology advances. For example, the surface roughness of a surface acoustic wave (SAW) filter device is required to be a few nm, and the flatness is required to be 20 nm or less.

As a substrate for forming a diamond thin film, Si single crystal, Mo, W, Pt, Si, C, $Si_3N_4$, AlN and so on can be used. These substrates have a very large thermal expansion coefficient as compared to diamond. When such a substrate is cooled from a high temperature of between about 800° C. and 1000° C., which is the substrate temperature during diamond deposition, a large strain (compressive strain in the film forming side and tensile strain on the substrate side) will be unavoidably induced in the diamond thin film or the like. A radial tensile stress on the boundary of the substrate is especially severe and can cause delamination.

In addition, as described above, a number of crystalline defects or strains are introduced during diamond film formation. Thus, in the flattening process of the diamond thin film, a distortion in shape has been unavoidable. In addition, there are many problems in the case where a free-standing diamond film having a specifically defined three-dimensional shape is required to be produced.

From the foregoing discussion, a diamond thin film according to the illustrative Example and having a substrate of two inches in diameter is precisely flattened and processed. Prior to the flattening and processing, a microwave of 1 GHz or more is irradiated on the diamond thin film and thereby heats the film. After microwave irradiation, the crystalline properties of the modified portion of the thin film is evaluated with the line width Raman spectrum, and it was 85% or less of the maximum line width of the non-modified portion of the diamond thin film. The line width of the non-modified portion is serially measured by removing and flattening the films from the growth front, ie. irradiated surface, and removing the substrate.

Next, the diamond thin film is machined with diamond tools. The degree of flatness after machining is 10 nm or less, and thus, a superior degree of flatness was achieved. At the same time, the mechanical reliability of the diamond thin film to withstand fracture has been significantly improved.

After the surface of the thin film was machined, the irradiation face of the free-standing diamond thin film with substrate removed was applied with a microwave of 1 GHz or more and was heated.

After the substrate was removed, the diamond thin film was free of compressive strain from the substrate. However, the thin film is often deformed in a recessed shape. This is repaired by performing proper microwave irradiation heating to thereby provide a free-standing film having very good flatness and improved strength.

As shown in the above illustrative Example, a microwave is irradiated on the growth front of as grown films on the substrate thereby making it possible to perform modifying. In the free-standing element, microwave can be irradiated to the initial growth face after the substrate has been removed. In this manner, a diamond thin film or the like can be modified in a manner similar to that in the crystal growth front.

In addition, by adjusting the temperature, time, power, frequency, atmosphere of microwave irradiation, the thickness of the modified layer of the irradiated element can be controlled or oblique modifying up to a certain depth can be carried out.

The thickness of diamond film or the like being an irradiated element is not limited in particular, and the diamond thin film can be modified when the film has a thickness of 0.01 micron or more.

As described above, modification with microwave irradiation according to the present invention can be carried out on the finally finished and processed plane which was subject to direct cutting, machine processing or polishing.

In addition, although a diamond thin film is described with respect to the above referenced Examples and Comparative Examples, the present invention is also equally applicable to CBN, BCN and CN thin films. It has been verified that the modification effect can be attained on such thin films.

Further, in the case where an attempt is made to semi-conduct a diamond thin film or the like simultaneously with modification, a reactive gas containing the semi-conducting element is introduced into an atmospheric gas or is introduced with a carbon supply gas source. Thus, at least part of the diamond can be semi-conducted.

Further, a high-quality or highly-oriented polycrystal film or single crystal film can be also formed on the a diamond thin film simultaneously with modification.

The microwave irradiation direction can be uniformly specified or it can be randomly reflected. A specific region of the thin film can be irradiated or the entire thin film can be uniformly irradiated. Thus, the present invention can be utilized to modify a local region or the entire film. The distribution and quantity of the residual strain can be controlled or modified, thereby making it possible to impart a desired shape to the diamond film.

In addition to decreasing and eliminating the strain inside the film through microwave irradiation and thereby increasing the strength of the diamond thin film, planar alignment of the thin film with the substrate is improved due to the decrease in strain, and therefore, the adhesive strength of the film to the substrate is also increased.

Further, a polycrystal, a preferred oriented film having an improved orientation and quality, or a diamond having single crystal characteristics can be formed through microwave irradiation according the present invention. For example, a plane which is cut or damaged by a YAG laser used for producing a device can be repaired through the use of microwave irradiation, and a diamond thin film or the like having greater uniformity can be formed.

The present invention is directed to a gas phase diamond thin film or the like formed on a substrate and/or removed from the substrate (ie. a free-standing diamond film) in which strain, defects, color and other irregularities are eliminated, reduced or are modified so that a preferentially oriented polycrystal or single crystal is formed. In the methods according to the present invention, the range and performance of strain or structure modification is remarkably improved compared to conventional electron beam heating or annealing methods which utilize a furnace. In addition, a diamond thin film can be modified safely with great reproducibility with the present invention. Moreover, the diamond thin film or the like can be modified at a low cost without requiring complicated machinery or control techniques.

In addition, by adjusting the temperature, time, power outputs, atmosphere, etc. of the microwave irradiation, the thickness of the layer modified can be adjusted or limited to a predetermined depth and there is no limitation as to the sequence of the modification process. To this end, a new high quality, highly oriented polycrystallile film or single crystal film can be formed on the modified layer simultaneously with the modification of the layer, or a laser-damaged portion of a face can be irradiated with microwave to repair the damaged portion of the film. Alternatively, the diamond thin film layer can be made semi-conductive during modification. Thus, the present invention has superior operability.

A diamond thin film or the like subjected to modification according to the present invention has a reduced amount of strain and defects and is provided with desirable characteristics such as high hardiness, low thermal expansion, low frictional sliding, high thermal conductivity, high electrical insulation, high sound speed, wide band gap semi-conductor characteristics, high velocity carrier capability, color centers negative electron affinity, bia-adaptibility, and superior acoustics. III addition, the present invention significantly improves the stability and mechanical reliability of the thin film and is applicable to all of the various uses of diamonds as described above.

What is claimed is:

1. A thin film selected from the group consisting of a diamond thin film, a CBN thin film, a BCN thin film, and a CN thin film, said thin film having a modified film thickness region in which a line width of a spectrum evaluated by Raman spectroscopy of at least 0.1 microns is substantially constant along a film thickness direction of said thin film, said thin film having an unmodified residual thickness which has a determinable maximum line width, and said line width of said modified film thickness region being no greater than about 85% of said maximum line width of said unmodified residual thickness.

2. A thin film according to claim 1, wherein at least a part of said modified film thickness region has a structure selected from the group consisting of a polycrystal, a preferentially oriented polycrystal, and a single crystal.

3. A thin film according to claim 2, wherein an additional layer is formed on said modified film thickness region of said thin film and said additional layer has a structure which is identical to said structure of said at least a part of said modified film thickness region.

4. A thin film according to claim 1, wherein said modified film thickness region includes a semi-conductor thin film layer.

5. A thin film according to claim 1, wherein at least a part of said thin film is covered with a layer selected from the group consisting of a metal layer, a ceramic layer, a conducting layer, and an insulating layer.

6. A thin film selected from the group consisting of a diamond thin film, a CBN thin film, a BCN thin film, and a CN thin film, said thin film having a modified film thickness region along a film thickness direction of said thin film and an unmodified residual part, said modified film thickness region having a reflection index which is at least 0.1% greater than a minimum reflection index of said unmodified residual part of said thin film.

7. A thin film according to claim 6, wherein at least a part of said modified film thickness region has a structure selected from the group consisting of a polycrystal, a preferentially oriented polycrystal, and a single crystal.

8. A thin film according to claim 7, wherein an additional layer is formed on said modified film thickness region of said thin film and said additional layer has a structure which is identical to said structure of said at least a part of said modified film thickness region.

9. A thin film according to claim 6, wherein said modified film thickness region includes a semi-conductor thin film layer.

10. A thin film according to claim 6, wherein at least a part of said thin film is covered with a layer selected from the group consisting of a metal layer, a ceramic layer, a conducting layer, and an insulating layer.

11. A method of forming a thin film, comprising the steps of:
    obtaining a thin film selected from the group consisting of a diamond thin film, a CBN thin film, a BCN thin film, and a CN thin film; and
    modifying said thin film by irradiating said thin film with a microwave of 1 to 500 GHz thereby heating said thin film.

12. A method according to claim 11, wherein said thin film is subjected to said modifying step in a controlled atmosphere selected from the group consisting of an evacuated atmosphere, an inert gas atmosphere, a reductive gas atmosphere, and a mixed atmosphere.

13. A method according to claim 12, wherein said thin film is heated to within a range of about 500° C. to 3000° C. during said modifying step.

14. A method according to claim 11, wherein said thin film is heated to within a range of about 500° C. to 3000° C. during said modifying step.

15. A method according to claim 11, wherein said obtained thin film is a thin film which was damaged by a laser beam cutting device or the like, and wherein said modifying step is utilized to repair said damaged thin film.

16. A method according to claim 11, further comprising a second modifying step in which said thin film is again in-adiated with a microwave of 1 to 500 GHz to further modify, heat and shape said thin film.

17. A method for forming a thin film, comprising the steps of:
    obtaining a thin film selected from the group consisting of a diamond thin film, a CBN thin film, a BCN thin film, and a CN thin film;
    modifying said thin film in a controlled atmosphere by irradiating said thin film with a microwave of 1 to 500 GHz thereby heating said thin film; and
    introducing at least one gas into said controlled atmosphere simultaneously with said modifying step, said at least one gas being selected from the group consisting of a hydrogen supply gas, a carbon supply gas, a nitrogen supply gas, a boron supply gas, and a gas containing a semi-conductor element;
    wherein said at least one gas modifies and simultaneously forms an additional thin film layer on said thin film, said additional thin film layer selected from the group consisting of a polycrystalline thin film, a preferentially oriented polycrystalline thin film, a single crystal thin film, and a semi-conductor thin film.

* * * * *

UNITED STATES PATENT AND TRADEMARK OFFICE
CERTIFICATE OF CORRECTION

PATENT NO. : 6,287,889 B1
DATED : September 11, 2001
INVENTOR(S) : Miyake et al.

It is certified that error appears in the above-identified patent and that said Letters Patent is hereby corrected as shown below:

Column 6,
Line 67, "Linder" should read -- under --

Column 12,
Line 1 "position" should read -- portion --

Column 14,
Line 27, "polycrystallile" should read -- polycrystalline --
Line 43, "III" should read -- in --

Column 16,
Line 17, "in-adiated" should read -- irradiated --

Signed and Sealed this

Nineteenth Day of March, 2002

Attest:

JAMES E. ROGAN
*Director of the United States Patent and Trademark Office*

*Attesting Officer*